United States Patent
Kong et al.

(10) Patent No.: US 11,205,998 B2
(45) Date of Patent: Dec. 21, 2021

(54) AMPLIFIER FOR REUSING CURRENT BY USING TRANSFORMER AND METHOD THEREOF

(71) Applicant: ELECTRONICS AND TELECOMMUNICATIONS RESEARCH INSTITUTE, Daejeon (KR)

(72) Inventors: Sun Woo Kong, Daejeon (KR); Kwang Seon Kim, Sejong (KR); Jee Hoon Park, Daejeon (KR); Kwang Chun Lee, Daejeon (KR); Hui Dong Lee, Daejeon (KR); Seung Hyun Jang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 96 days.

(21) Appl. No.: 16/788,177

(22) Filed: Feb. 11, 2020

(65) Prior Publication Data
US 2020/0266775 A1    Aug. 20, 2020

(30) Foreign Application Priority Data
Feb. 15, 2019    (KR) .......................... 10-2019-0017587

(51) Int. Cl.
  H03F 1/22       (2006.01)
  H03F 1/34       (2006.01)
  H03F 3/193      (2006.01)
  H03F 1/56       (2006.01)
  H03F 3/195      (2006.01)

(52) U.S. Cl.
  CPC .......... *H03F 3/1935* (2013.01); *H03F 1/226* (2013.01); *H03F 1/347* (2013.01); *H03F 1/565* (2013.01); *H03F 3/195* (2013.01); *H03F 2200/318* (2013.01); *H03F 2200/391* (2013.01); *H03F 2200/451* (2013.01)

(58) Field of Classification Search
  CPC . H03F 1/22; H03F 1/223; H03F 1/226; H03F 2200/537; H03F 2200/541; H03F 1/193; H03F 3/193; H03F 1/347
  USPC .......................... 330/165, 195, 311, 302, 79
  See application file for complete search history.

(56) References Cited

U.S. PATENT DOCUMENTS

| | | |
|---|---|---|
| 8,125,276 B2 | 2/2012 | An et al. |
| 8,212,625 B2 | 7/2012 | Lee et al. |
| 8,792,836 B2 | 7/2014 | Mikhemar et al. |
| 8,803,614 B2* | 8/2014 | Giammello ........... H03F 3/4508 330/302 |
| 9,306,502 B2 | 4/2016 | Chan |

(Continued)

*Primary Examiner* — Steven J Mottola

(57) ABSTRACT

An amplifier may comprise first and second matching networks; first and second transistors; and a transformer including first to third inductors. Also, a gate and a source of the first transistor are connected to the first matching network, one end of the first inductor is connected to a drain of the first transistor, the other end of the first inductor is connected to a source of the second transistor, one end of the second inductor is connected to a gate of the second transistor, the other end of the second inductor is grounded, one end of the third inductor is connected to a drain of the second transistor, and the other end of the third inductor is connected to the second matching network.

18 Claims, 12 Drawing Sheets

(56) References Cited

U.S. PATENT DOCUMENTS

| | | |
|---|---|---|
| 9,712,195 B2 | 7/2017 | Wang et al. |
| 9,831,832 B2 | 11/2017 | Liu et al. |
| 10,079,579 B2 | 9/2018 | Kong et al. |
| 2003/0141953 A1 | 7/2003 | William et al. |

\* cited by examiner

100

AMPLIFIER FOR REUSING CURRENT BY USING TRANSFORMER AND METHOD THEREOF

CROSS-REFERENCE TO RELATED APPLICATIONS

This application claims priority to Korean Patent Application No. 10-2019-0017587 filed on Feb. 15, 2019 with the Korean Intellectual Property Office (KIPO), the entire contents of which are hereby incorporated by reference.

BACKGROUND

1. Technical Field

The present disclosure relates generally to an amplifier, and more specifically, to an amplifier for reusing current by using a transformer, and an operation method thereof.

2. Related Art

In order to smoothly transmit and receive a wireless signal in a wireless communication system, it is necessary to amplify the wireless signal at a radio frequency (RF). For example, in a wireless communication system, a transceiver may amplify a transmit signal or a receive signal using an RF amplifier. Here, the RF amplifier may amplify and output the magnitude of the transmit signal. Also, the RF amplifier may amplify the receive signal into a signal having a processable magnitude.

Meanwhile, the RF may vary according to the type of wireless communication system. The wireless communication system may operate in a high frequency band. Accordingly, the wireless communication systems may require an RF amplifier operating in the high frequency band. The RF amplifier operating in the high frequency band should meet three requirements. First, the RF amplifier should have high stability. For example, an RF amplifier having low stability may generate an output signal due to oscillation even when no input signal is present. Second, the RF amplifier should guarantee a sufficiently large gain at the RF. For example, the RF amplifier may usually meet requirements of a wireless communication system when amplifying a signal at an RF stage. Third, the RF amplifier should have low power consumption. For example, the RF amplifier may have difficulty in achieving a high gain due to parasitic components or load configurations in RF. Thus, the RF amplifier may operate in a manner that uses a lot of power to increase the gain. However, when a large amount of power is used in the RF amplifier, a problem may occur that the power efficiency of the entire wireless communication system is reduced.

SUMMARY

Accordingly, exemplary embodiments of the present disclosure provide an amplifier having a structure capable of offsetting a parasitic capacitance component generated inside a transformer of the amplifier.

According to an exemplary embodiment of the present disclosure, an amplifier may comprise first and second matching networks; first and second transistors; and a transformer including first to third inductors. Also, a gate and a source of the first transistor are connected to the first matching network, one end of the first inductor is connected to a drain of the first transistor, the other end of the first inductor is connected to a source of the second transistor, one end of the second inductor is connected to a gate of the second transistor, the other end of the second inductor is grounded, one end of the third inductor is connected to a drain of the second transistor, and the other end of the third inductor is connected to the second matching network.

The transformer may comprise first to third layers, the first inductor may be disposed in the first layer, the second inductor may be disposed in the second layer, and the third inductor may be disposed in the third layer.

The second inductor may be disposed to surround an outer side of the first inductor, and the third inductor may be disposed to surround an outer side of the second inductor.

The first matching network may output an electrical signal input through an input port to the gate of the first transistor, and the first transistor may output the electrical signal to the first inductor through the drain of the first transistor.

The first inductor may form a first magnetic flux in accordance with an electrical signal, the second inductor may form a second magnetic flux by the first magnetic flux, and a direction of the second magnetic flux may be opposite to a direction of the first magnetic flux.

The second transistor may form a voltage at each of the source and the gate of the second transistor by the first magnetic flux, and a phase difference between the voltages of the source and gate of the second transistor may be 180 degrees.

The third inductor may form a third magnetic flux by the second magnetic flux, and a direction of the third magnetic flux may be equal to the direction of the second magnetic flux.

The first to third inductors may be electromagnetically coupled.

According to another exemplary embodiment of the present disclosure, a communication node may comprise an antenna and an amplifier connected to the antenna. Also, the amplifier may comprise first and second matching networks; first and second transistors; and a transformer including first to third inductors. Also, a gate and a source of the first transistor are connected to the first matching network, one end of the first inductor is connected to a drain of the first transistor, the other end of the first inductor is connected to a source of the second transistor, one end of the second inductor is connected to a gate of the second transistor, the other end of the second inductor is grounded, one end of the third inductor is connected to a drain of the second transistor, and the other end of the third inductor is connected to the second matching network.

The transformer may comprise first to third layers, the first inductor may be disposed in the first layer, the second inductor may be disposed in the second layer, and the third inductor may be disposed in the third layer.

The second inductor may be disposed to surround an outer side of the first inductor, and the third inductor may be disposed to surround an outer side of the second inductor.

The first matching network may output an electrical signal input through an input port to the gate of the first transistor, and the first transistor may output the electrical signal to the first inductor through the drain of the first transistor.

The first inductor may form a first magnetic flux in accordance with an electrical signal, the second inductor may form a second magnetic flux by the first magnetic flux, and a direction of the second magnetic flux may be opposite to a direction of the first magnetic flux.

The second transistor may form a voltage at each of the source and the gate of the second transistor by the first magnetic flux, and a phase difference between the voltages of the source and gate of the second transistor may be 180 degrees.

The third inductor may form a third magnetic flux by the second magnetic flux, and a direction of the third magnetic flux may be equal to the direction of the second magnetic flux.

The first to third inductors may be electromagnetically coupled.

The communication node may further comprise a transmit signal processor, the amplifier may amplify a transmit signal output by the transmit signal processor, and the antenna may radiate the amplified transmit signal.

The communication node may further comprise a receive signal processor, the antenna may receive a receive signal, the amplifier may amplify the receive signal, and the receive signal processor may process the amplified receive signal.

The stability and gain of the amplifier can be increased through the structure of the amplifier according to the exemplary embodiments of the present disclosure. In addition, the noise factor (NF) of the amplifier can be improved through the structure of the amplifier according to the exemplary embodiments of the present disclosure. The structure of the amplifier according to the exemplary embodiments of the present disclosure can increase the space use efficiency of the amplifier. Further, power efficiency can be increased by reusing current through the structure of the amplifier according to the exemplary embodiments of the present disclosure.

BRIEF DESCRIPTION OF DRAWINGS

Embodiments of the present disclosure will become more apparent by describing in detail embodiments of the present disclosure with reference to the accompanying drawings, in which.

Figure 1:
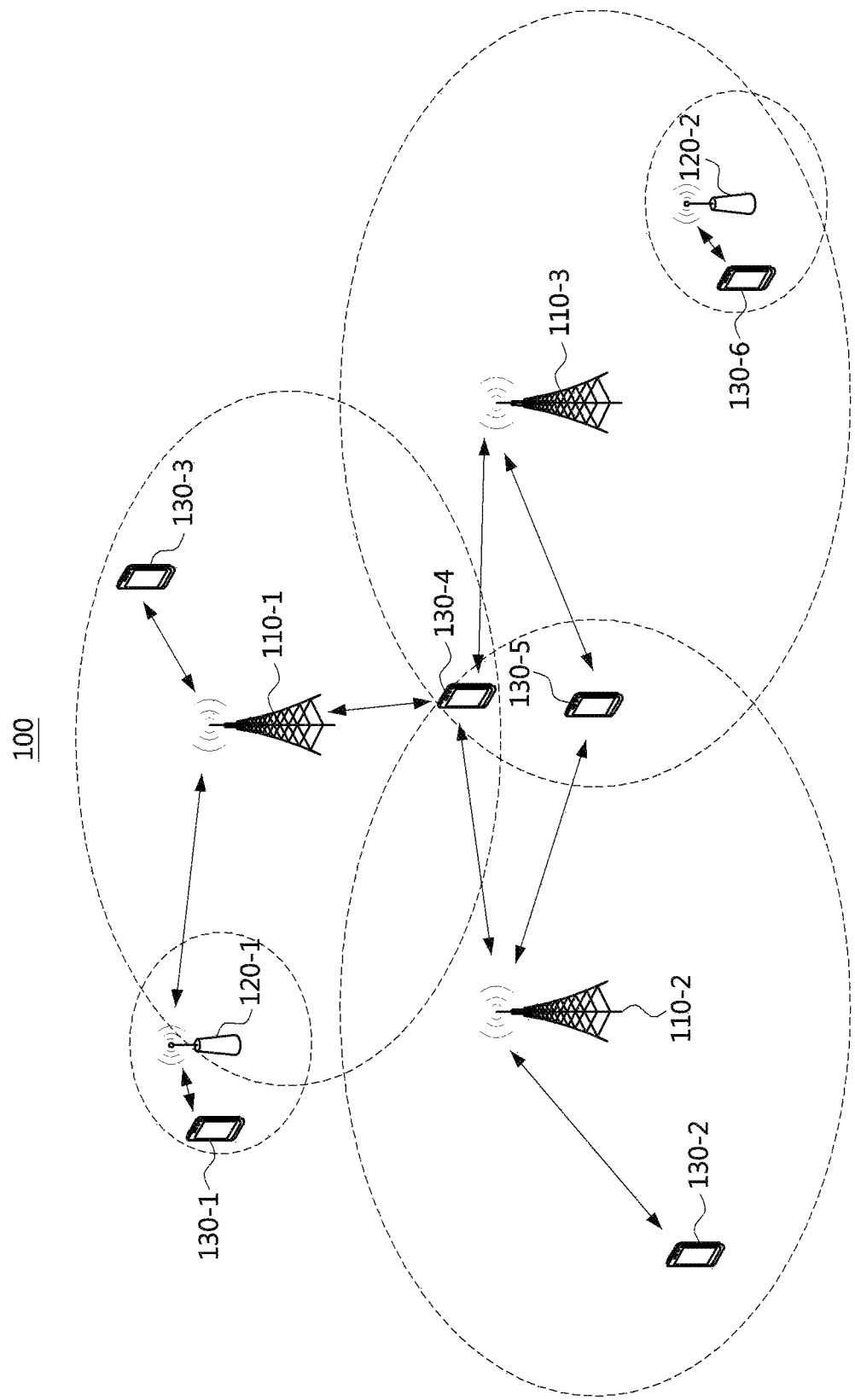
FIG. 1 is a conceptual diagram illustrating a communication system according to an exemplary embodiment of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in greater detail with reference to the accompanying drawings. In order to facilitate general understanding in describing the present disclosure, the same components in the drawings are denoted with the same reference signs, and repeated description thereof will be omitted.

Throughout the specification, a terminal may be a mobile terminal (MT), a mobile station (MS), an advanced mobile station (AMS), a high reliability mobile station (HR-MS), a subscriber station (SS), a portable subscriber station (PSS), an access terminal (AT), an user equipment (UE), or the like. Also, the terminal may include all or a part of functions of MT, MS, AMS, HR-MS, SS, PSS, AT, UE, or the like. Various exemplary embodiments of the terminal may include a cellular telephone, a smart phone having a wireless communication function, a personal digital assistant (PDA) having a wireless communication function, a wireless modem, a portable computer having a wireless communication function, a digital camera having a wireless communication function, a gaming device having wireless communication function, music storage and playback appliances with wireless communication capability, and internet appliances with wireless Internet access and browsing, as well as portable units or terminals incorporating combinations of such functions. However, the present disclosure is not limited thereto.

Also, a base station may be an advanced base station (ABS), a high reliability base station (HR-BS), a node B, an evolved node B (eNB), an access point (AP), a radio access station (RAS), a base transceiver station (BTS), a mobile multi-hop relay (MMR)-BS, a relay station (RS) performing a role of the base station, a high reliability relay station (HR-RS) performing a role of the base station, a small cell base station, or the like.

FIG. 1 is a conceptual diagram illustrating a communication system according to an exemplary embodiment of the present disclosure.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. The plurality of communication nodes may support 4G communication (e.g., long term evolution (LTE), LTE-advanced (LTE-A)), 5G communication (e.g., new radio (NR)), or the like. The 4G communication may be performed in a frequency band below 6 GHz, and the 5G communication may be performed in a frequency band above 6 GHz as well as the frequency band below 6 GHz.

For example, for the 4G communication and the 5G communication, the plurality of communication nodes may support code division multiple access (CDMA) technology, wideband CDMA (WCDMA) technology, time division multiple access (TDMA) technology, frequency division multiple access (FDMA) technology, orthogonal frequency division multiplexing (OFDM) technology, filtered OFDM technology, cyclic prefix OFDM (CP-OFDM) technology, discrete Fourier transform-spread-OFDM (DFT-s-OFDM) technology, single carrier FDMA (SC-FDMA) technology, non-orthogonal multiple access (NOMA) technology, generalized frequency division multiplexing (GFDM) technology, filter band multi-carrier (FBMC) technology, universal filtered multi-carrier (UFMC) technology, space division multiple access (SDMA) technology, or the like.

Also, the communication system 100 may further comprise a core network. When the communication system supports the 4G communication, the core network may include a serving gateway (S-GW), a packet data network (PDN) gateway (P-GW), a mobility management entity (MME), and the like. When the communication system 100 supports the 5G communication, the core network may include an access and mobility management function (AMF), a user plane function (UPF), a session management function (SMF), and the like.

Meanwhile each of the plurality of communication nodes 110-1, 110-2, 110-3, 120-1, 120-2, 130-1, 130-2, 130-3, 130-4, 130-5, and 130-6 constituting the communication system 100 may have the following structure.

Figure 2:
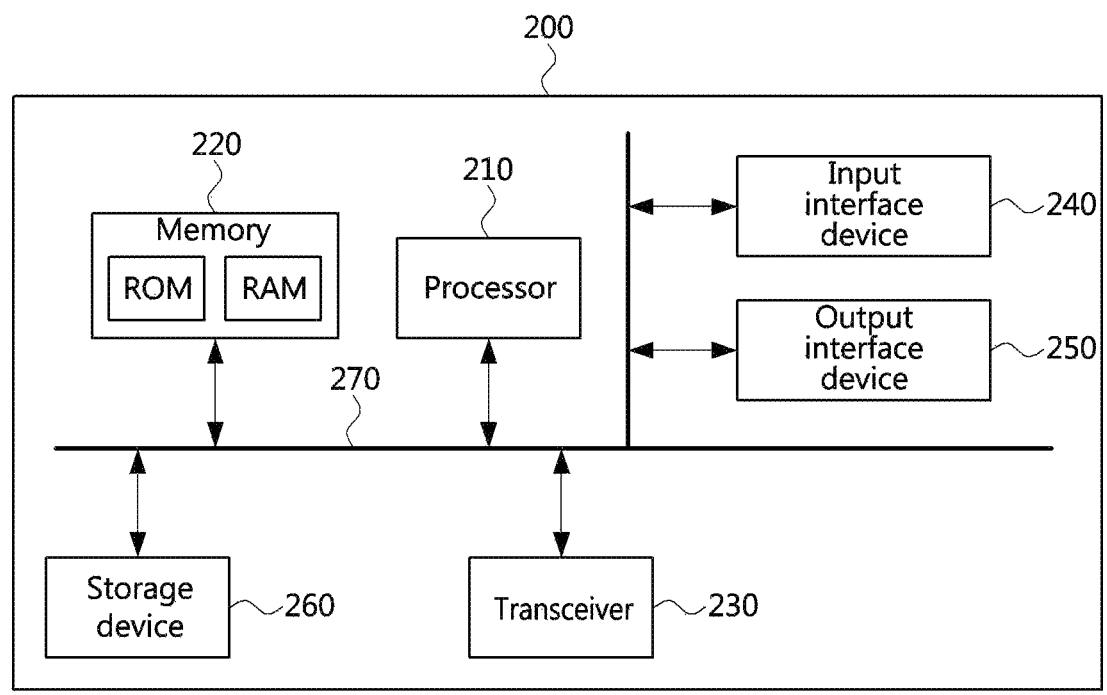
FIG. 2 is a block diagram illustrating a structure of a communication node in a communication system according to an exemplary embodiment of the present disclosure.

FIG. 2 is a block diagram illustrating a structure of a communication node in a communication system according to an exemplary embodiment of the present disclosure.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

However, each component included in the communication node 200 may not be connected to the common bus 270 but may be connected to the processor 210 via an individual interface or a separate bus. For example, the processor 210 may be connected to at least one of the memory 220, the transceiver 230, the input interface device 240, the output interface device 250 and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Figure 3:
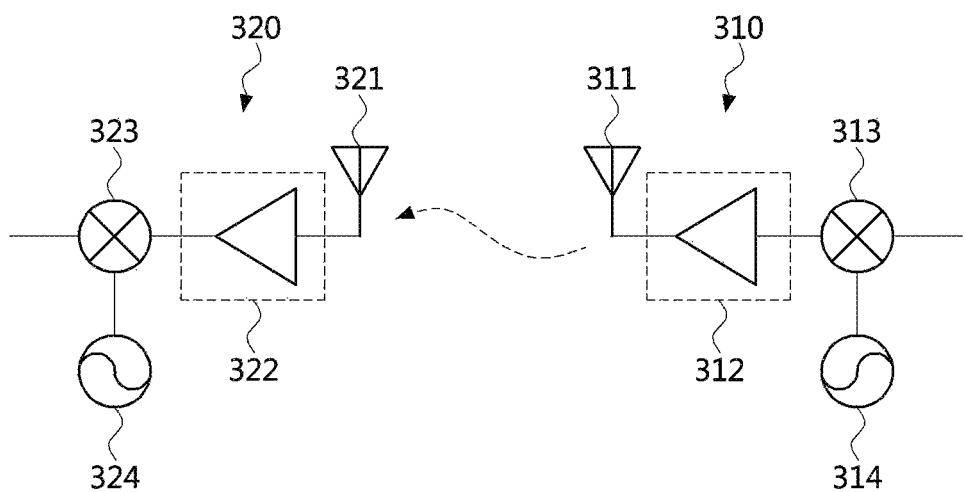
FIG. 3 is a conceptual diagram illustrating a transmitter and a receiver in a wireless communication system according to an exemplary embodiment of the present disclosure.

FIG. 3 is a conceptual diagram illustrating a transmitter and a receiver in a wireless communication system according to an exemplary embodiment of the present disclosure.

Referring to FIG. 3, in a wireless communication system 300, a transmitter 310 may transmit a radio signal to a receiver 320. Here, the wireless communication system 300 may be the same as or similar to the wireless communication system 100 of FIG. 1. The transmitter 310 may include the transceiver 230 of FIG. 2. Also, the receiver 320 may include the transceiver 230 of FIG. 2.

For example, the transmitter 310 may include an antenna 311, an amplifier 312, a mixer 313, and a local oscillator 314. The transmitter 310 may convert a baseband signal through the mixer 313 and the local oscillator 314. Also, the transmitter 310 may amplify the converted signal through the amplifier 312 and then transmit the amplified signal through the antenna 311 to the receiver 320.

The receiver 320 may include an antenna 321, an amplifier 322, a mixer 323, and a local oscillator 324. The receiver 320 may receive the signal transmitted by the transmitter 310 through the antenna 321. The receiver 320 may amplify the received signal through the amplifier 323. The receiver 320 may convert the amplified signal into a baseband signal through the mixer 323 and the local oscillator 324.

Here, the amplifiers 312 and 322 may be greatly influenced by parasitic components of circuits. Thus, designs for the amplifiers 312 and 322 need to consider stability, gain, and power consumption.

Figure 4:
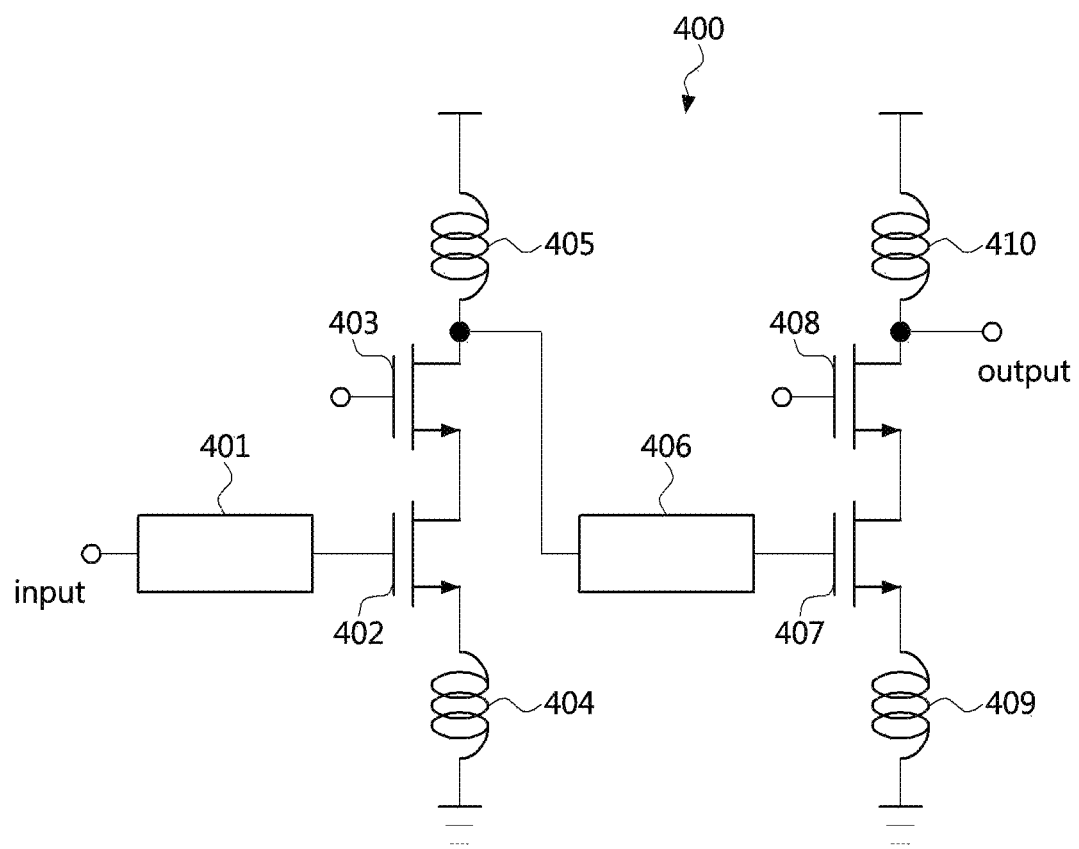
FIG. 4 is a circuit diagram illustrating a structure of an amplifier of the transceiver according to an exemplary embodiment of the present disclosure.

For example, each of the amplifiers 312 and 322 may be designed as shown in FIG. 4 below.

FIG. 4 is a circuit diagram illustrating a structure of an amplifier of the transceiver according to an exemplary embodiment of the present disclosure.

Referring to FIG. 4, an amplifier 400 may include a first stage and a second stage in a cascode structure. Here, the amplifier 400 may be each of the amplifiers 312 and 322 of FIG. 3.

For example, the first stage may include a first matching network 401, a first transistor 402, a second transistor 403, a first inductor 404, and a second inductor 405. Also, the second stage may include a second matching network 406, a third transistor 407, a fourth transistor 408, a third inductor 409, and a fourth inductor 410.

The first transistor 402 may include a gate, a source, and a drain. The second transistor 403 may include a gate, a source, and a drain. The third transistor 407 may include a gate, a source, and a drain. Also, the fourth transistor 408 may include a gate, a source, and a drain.

For example, an input end of the first matching network 401 may be connected to an input port of the amplifier 400. The gate of the first transistor 402 may be connected to an output end of the first matching network 401. The source of the first transistor 402 may be connected to one end of the first inductor 404. The other end of the first inductor 404 may be grounded. The drain of the second transistor 403 may be connected to one end of the second inductor 405 and an input end of the second matching network 406.

The gate of the third transistor 407 may be connected to an output end of the second matching network 406. The source of the third transistor 407 may be connected to one end of the third inductor 409. The other end of the third inductor 409 may be grounded. The drain of the third transistor 407 may be connected to the source of the fourth transistor 408. The drain of the fourth transistor 408 may be connected to one end of the fourth inductor 410 and an output port of the amplifier 400.

The first matching network 401 may perform impedance matching between elements of the first stage. In addition, the second matching network 406 may perform impedance matching between elements of the second stage.

The first transistor 402 and the second transistor 403 may be arranged in a stack structure. The first transistor 402 may have a common-source structure. The second transistor 403 may have a common-gate structure. For example, a current used in the first transistor 402 may be reused in the second transistor 403.

The amplifier 400 having a cascode structure may solve an oscillation problem that may be caused by a feedback capacitance at a low frequency. For example, the amplifier 400 designed with a cascode structure may increase isolation between an input signal and an output signal. Also, the amplifier 400 having a cascode structure may obtain a high gain through a high output impedance.

Figure 5:
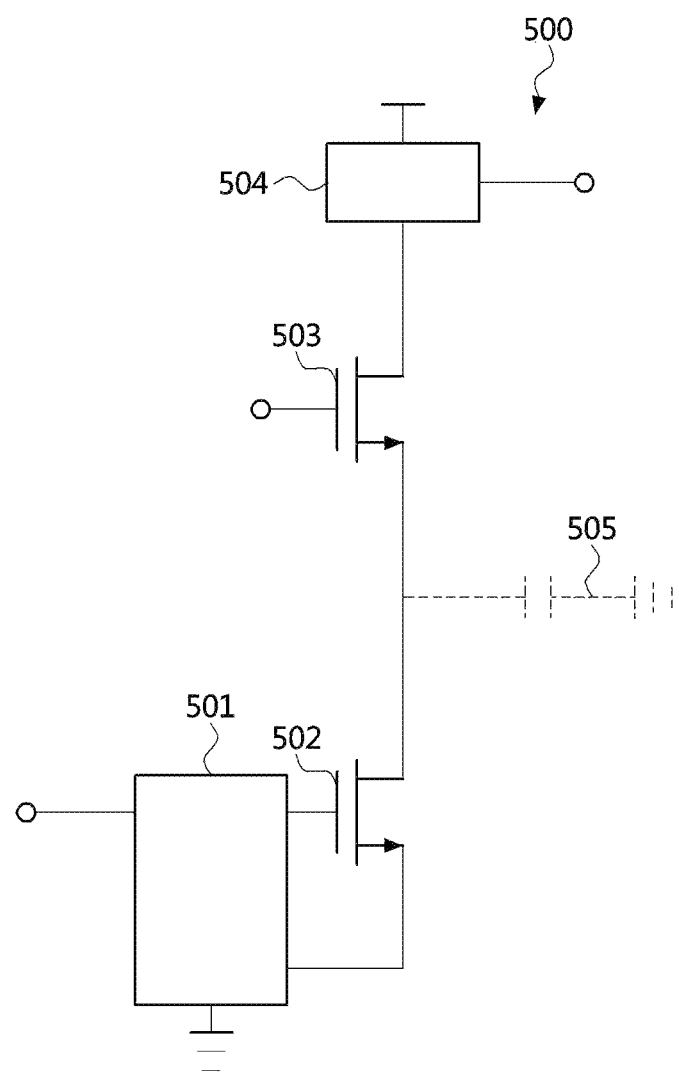
FIG. 5 is a circuit diagram illustrating a structure of an amplifier according to an exemplary embodiment of the present disclosure, and parasitic capacitance components thereof.

Meanwhile, the amplifier 400 designed in a cascode structure may generate parasitic capacitance components as shown in FIG. 5.

FIG. 5 is a circuit diagram illustrating a structure of an amplifier according to an exemplary embodiment of the present disclosure, and parasitic capacitance components thereof.

Referring to FIG. 5, an amplifier 500 may include a matching network 501, a first transistor 502, a second transistor 503, and a load 504.

In the amplifier 500 having the cascode structure, performance may decrease as a radio frequency (RF) increases. For example, a parasitic capacitance component 505 may be generated between the first transistor 502 and the second transistor 503. The RF signal output from the first transistor 501 may not be transmitted to the second transistor 502 due to the parasitic capacitance component 505. Thus, the amplifier 500 may have a low gain when considering power consumption due to the parasitic capacitance component 505. Also, the amplifier 500 may cause a problem in which a noise factor (NF) is increased due to the parasitic capacitance component 505.

Figure 6A:
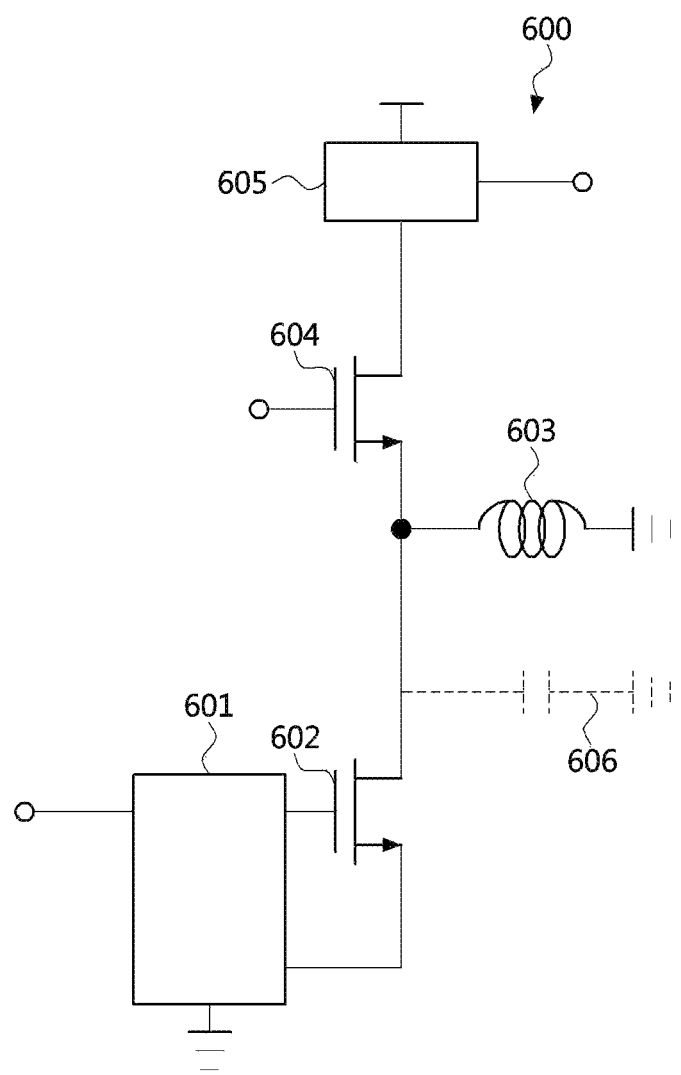
FIGS. 6A and 6B are circuit diagrams illustrating a structure of an amplifier according to another exemplary embodiment of the present disclosure.
Figure 6B:
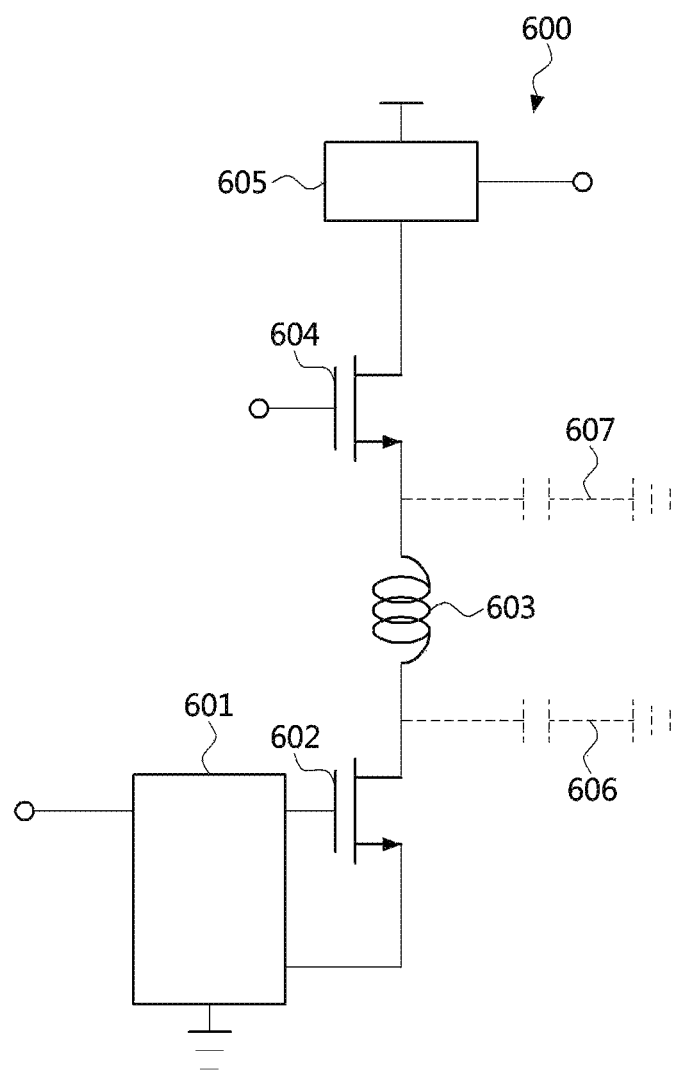

Meanwhile, an amplifier may be designed in a structure as shown in FIGS. 6A and 6B below to solve the above problems.

FIGS. 6A and 6B are circuit diagrams illustrating a structure of an amplifier according to another exemplary embodiment of the present disclosure.

Referring to FIG. 6A, an amplifier 600 may include a matching network 601, a first transistor 602, an inductor 603, a second transistor 604, and a load 605. For example, a gate and a source of the first transistor 602 may be connected to the matching network 601. One end of the inductor 603 may be connected to a drain of the first transistor 602 and a source of the second transistor 604. Also, the other end of the inductor 603 may be grounded. The inductor 603 may shunt a first parasitic capacitance component 606 generated between the first transistor 602 and the second transistor 604.

Meanwhile, referring to FIG. 6B, the inductor 603 may be connected in series with the first transistor 602 and the second transistor 604. In this case, the inductor 603 may prevent resonance between a first parasitic capacitance component 607 and a second parasitic capacitance component 608 generated between the first transistor 602 and the second transistor 604.

Through the above-described structure, the amplifier 600 may reduce the influence of parasitic capacitance components. However, the above-described structure may cause a problem that an area of use is increased in implementing an integrated circuit due to the inductor added to compensate for parasitic capacitance components.

Figure 7:
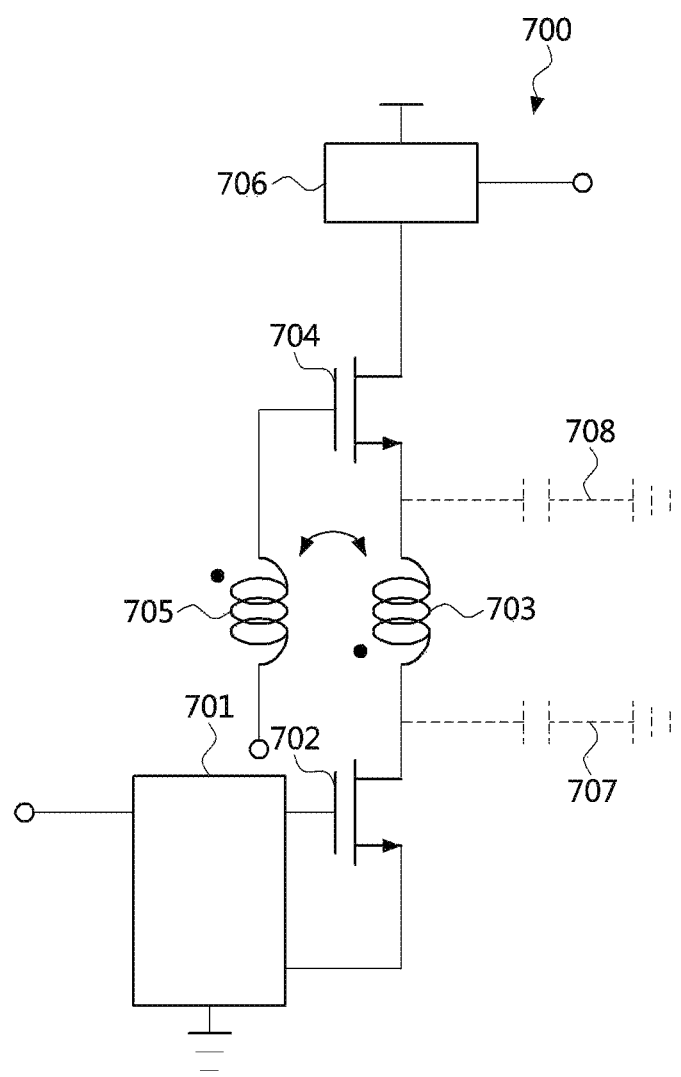
FIG. 7 is a circuit diagram illustrating a structure of an amplifier according to another exemplary embodiment of the present disclosure.

Meanwhile, an amplifier may be designed to have a structure as shown in FIG. 7 to solve the above problem.

FIG. 7 is a circuit diagram illustrating a structure of an amplifier according to another exemplary embodiment of the present disclosure.

Referring to FIG. 7, an amplifier 700 may include a matching network 701, a first transistor 702, a first inductor 703, a second transistor 704, a second inductor 705, and a load 706. For example, a gate and a source of the first transistor 702 may be connected to the matching network 701. One end of the first inductor 703 may be connected in series with a drain of the first transistor 702 and a source of the second transistor 704. One end of the second inductor 705 may be connected to a gate of the second transistor 704. The other end of the second inductor 705 may be grounded.

When currents are input respectively to nodes connected to the gate and the source of the second transistor 704, the direction of the magnetic flux of the first inductor 703 and the direction of the magnetic flux of the second inductor 705 are opposite to each other.

For example, the first inductor 703 may generate magnetic flux by a current flowing from the first transistor 702 to the first inductor 703. Also, the magnetic flux generated by the first inductor 703 may form voltages having symmetrical phases in the source and the gate of the second transistor 704. Accordingly, the magnetic flux generated by the first inductor 703 may increase (i.e., boosts) a transconductance of the second transistor 704.

Meanwhile, the effect of increasing the transconductance of the second transistor 704 may be limited due to a positive feedback effect by the second inductor 705. For example, a change in scattering parameters and a change in stability factor according to a frequency magnitude of a signal input to the second inductor 705 will be described with reference to FIGS. 8 and 9 below.

Figure 8:
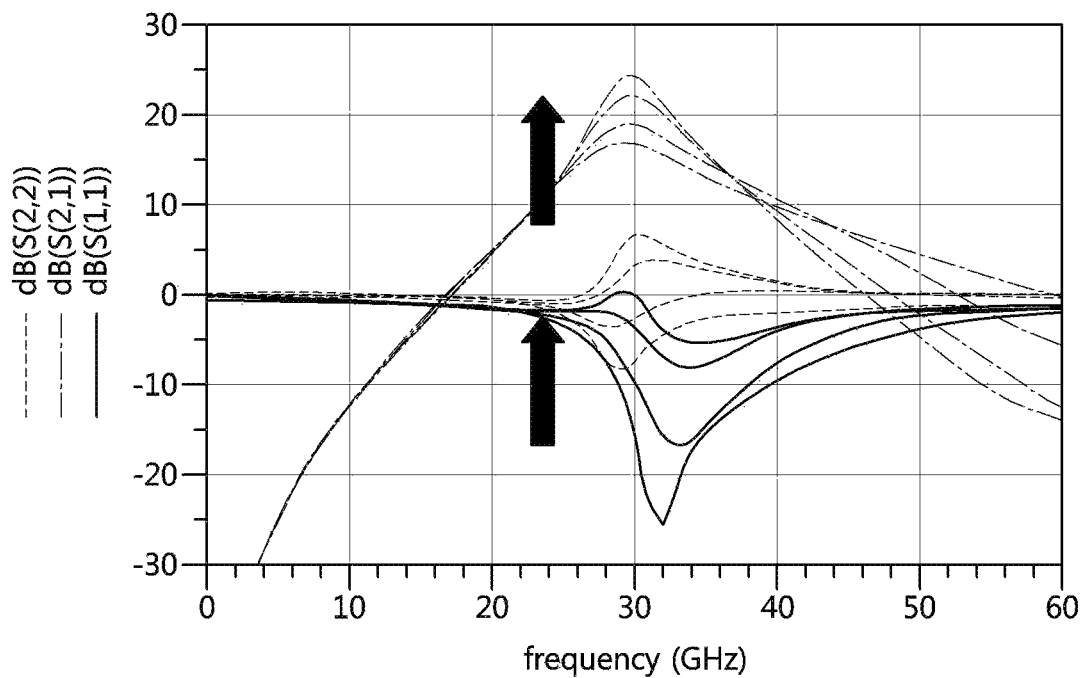
FIG. 8 is a graph illustrating changes in scattering-parameters according to a frequency of a signal input to a second inductor of an amplifier according to an exemplary embodiment of the present disclosure.

FIG. 8 is a graph illustrating changes in scattering-parameters according to a frequency of a signal input to a second inductor of an amplifier according to an exemplary embodiment of the present disclosure.

Referring to FIG. 8, a solid line shows a change in a scattering-parameter S(1,1) according to a frequency of a signal input to the second inductor of the amplifier. An alternated long and short dash line shows a change in a scattering-parameter S(2,1) according to the frequency of the signal input to the second inductor of the amplifier. A dotted line shows a change of a scattering-parameter S(2,2) according to the frequency of the signal input to the second inductor of the amplifier. Here, the amplifier may be the same as or similar to the amplifier 700 of FIG. 7. Also, the second inductor may be the same as or similar to the second inductor 705 of FIG. 7.

The scattering-parameter S(1,1) may change unstably to be less than zero depending on the frequency of the second inductor. Also, the scattering-parameter S(2,1) may also change unstably. For example, S(2,1) may increase as the frequency of the second inductor increases, and then become less than zero. Also, the scattering-parameter S(2,2) may change unstably. For example, S(2,2) may increase, decrease, or become less than zero as the frequency of the second inductor increases.

Figure 9:
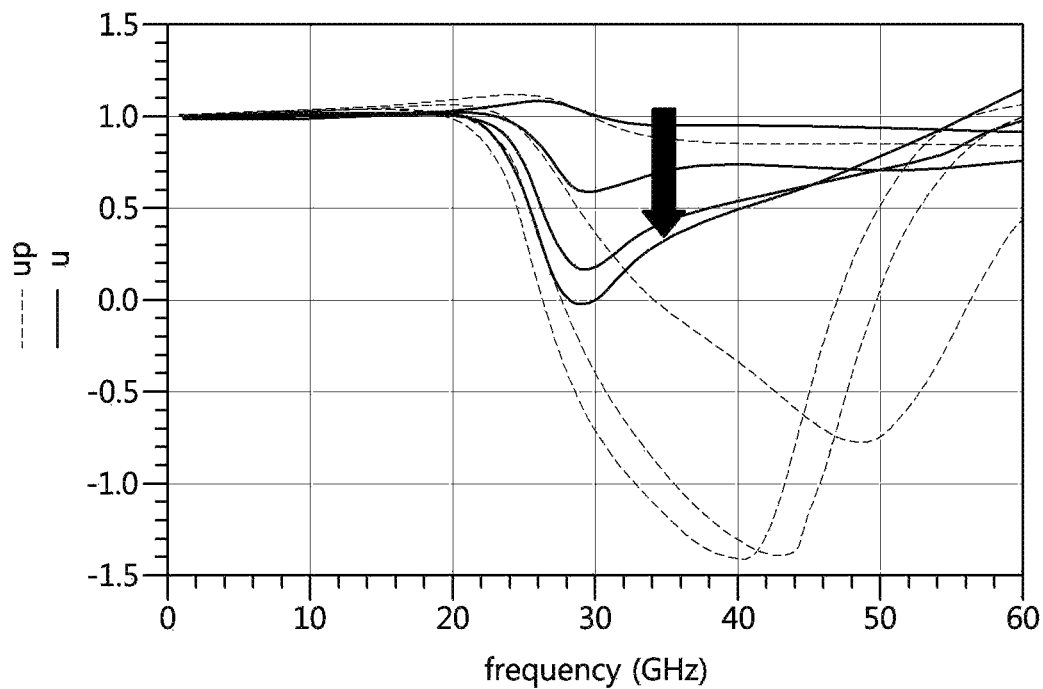
FIG. 9 is a graph illustrating a stability factor according to a frequency of a signal input to a second inductor of an amplifier according to an exemplary embodiment of the present disclosure.

FIG. 9 is a graph illustrating a stability factor according to a frequency of a signal input to a second inductor of an amplifier according to an exemplary embodiment of the present disclosure.

Referring to FIG. 9, a solid line shows a change in a stability factor of an input signal of an amplifier according to a frequency of a signal input to a second inductor of an amplifier. A dotted line showings a change in a stability factor of an output signal of an amplifier according to the frequency of the signal input to the second inductor of the amplifier. Here, the amplifier may be the same as or similar to the amplifier 700 of FIG. 7. Also, the second inductor may be the same as or similar to the second inductor 705 of FIG. 7.

The stability factor of the input signal may change unstably according to the change in the frequency of the signal input to the second inductor of the amplifier. Similarly, the stability factor of the output signal may change unstably in accordance with the change in the frequency of the signal input to the second inductor of the amplifier.

Referring to FIGS. 8 and 9, the second inductor 705 for improving the gain of the amplifier 700 may reduce the stability of the amplifier 700. Meanwhile, a structure of an amplifier considering both gain and stability will be described with reference to FIGS. 10A and 10B below.

Figure 10A:
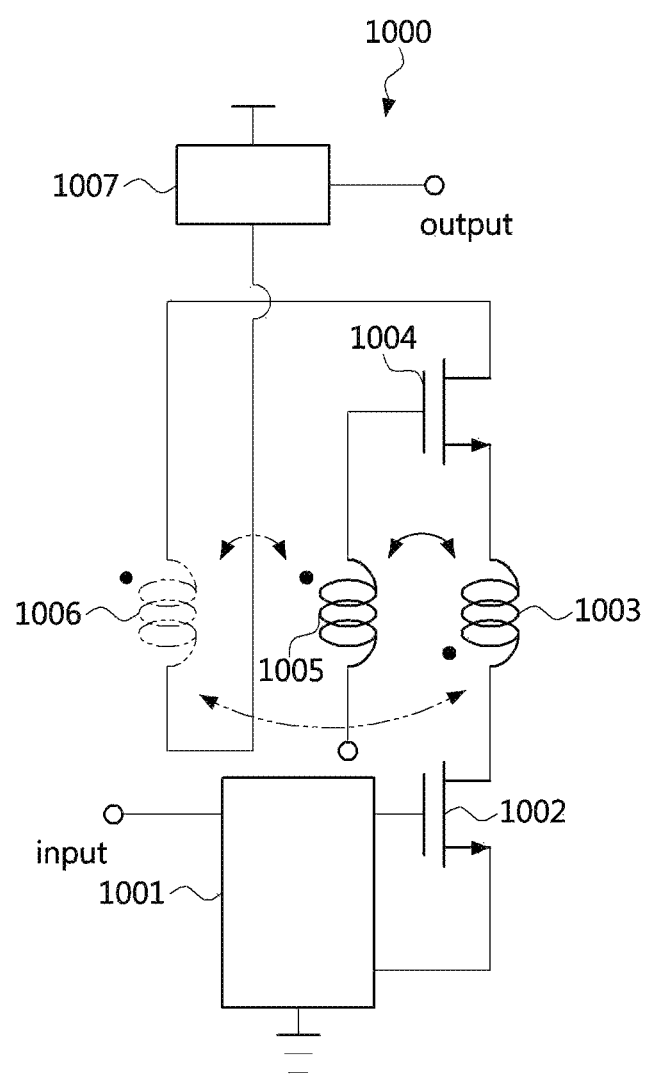
FIGS. 10A and 10B are circuit diagrams illustrating a structure of an amplifier according to an exemplary embodiment of the present disclosure.
Figure 10B:
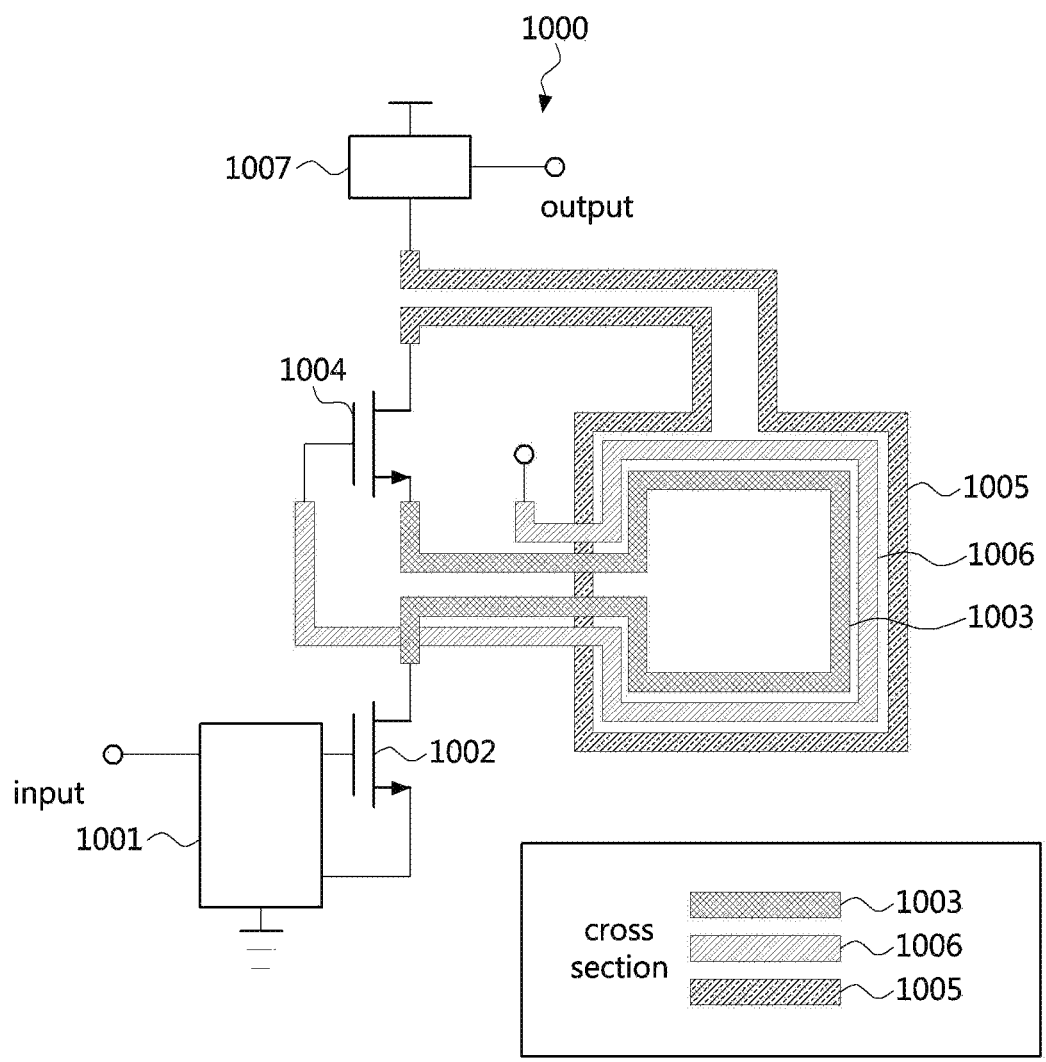

FIGS. 10A and 10B are circuit diagrams illustrating a structure of an amplifier according to an exemplary embodiment of the present disclosure.

Referring to FIG. 10A, an amplifier 1000 may include a matching network 1001, a first transistor 1002, a first inductor 1003, a second transistor 1004, a second inductor 1005, and a third inductor 1006, and a second matching network 1007.

A gate and a source of the first transistor 1002 may be connected to the matching network 1001. One end of the first inductor 1003 may be connected in series with a drain of the first transistor 1002 and a source of the second transistor 1004. One end of the second inductor 1005 may be connected to a gate of the second transistor 1004. One end of the second inductor 1005 may be grounded. One end of the third inductor 1006 may be connected to a drain of the second transistor 1004. The other end of the third inductor 1006 may be connected to the second matching network 1007.

When currents are input respectively to nodes connected to the gate and the source of the second transistor 1004, the direction of the magnetic flux of the first inductor 1003 and the direction of the magnetic flux of the second inductor 1005 are opposite to each other.

For example, the first inductor 1003 may generate magnetic flux by a current flowing from the first transistor 1002 to the first inductor 1003. Also, the magnetic flux generated by the first inductor 1003 may form voltages having symmetrical phases in the source and the gate of the second transistor 1004. Accordingly, the magnetic flux generated by the first inductor 1003 may increase (i.e., boosts) a transconductance of the second transistor 1004.

One end of the third inductor 1006 may be connected to the drain of the second transistor 1004. The other end of the third inductor 1006 may be connected to the second matching network 1007. The third inductor 1006 may be electromagnetically coupled with the second inductor 1005. For example, when currents are input respectively to nodes connected to the gate and the drain of the second transistor 1004, the second inductor 1005 and the third inductor 1006 may form magnetic fluxes in the same direction.

A current flowing through a feedback capacitor of the second transistor 1004 may be offset by a current flowing through the third inductor 1006. That is, the magnetic fluxes in the same direction formed by the second inductor 1005 and the third inductor 1006 may solve an oscillation problem due to positive feedback.

That is, the above-described structure of the amplifier 1000 may increase power gain while reducing the influence of parasitic capacitance components occurring at the contacts of the first transistor 1002 and the second transistor 1004 at a high frequency. In addition, the structure of the amplifier 1000 described above may improve the stability of the amplifier 1000.

Meanwhile, the first inductor 1003, the second inductor 1005, and the third inductor 1006 constituting the transformer of the amplifier 1000 may be arranged as shown in FIG. 10B below.

Referring to FIG. 10B, the amplifier 1000 may be implemented as an integrated circuit (IC). For example, the transformer of the amplifier 1000 may include a plurality of layers. In this case, the first inductor 1003 may be disposed in the first layer of the transformer. The second inductor 1005 may be disposed in the second layer of the transformer. The third inductor 1006 may be disposed in the third layer of the transformer. Here, the first layer may be formed on top of the second layer. The second layer may be formed on top of the third layer.

Alternatively, the arrangement order of the first inductor 1003 to the third inductor 1006 may be configured variously. For example, the first inductor 1003 may be disposed in the second layer of the transformer. The second inductor 1005 may be disposed in the third layer of the transformer. The third inductor 1006 may be disposed in the first layer of the transformer. Alternatively, the first inductor 1003 may be disposed in the third layer of the transformer. The second inductor 1005 may be disposed in the first layer of the transformer. The third inductor 1006 may be disposed in the second layer of the transformer.

Alternatively, the transformer of the amplifier 1000 may be configured in a single layer. In this case, the second inductor 1005 may be wound in a form surrounding the outer side of the first inductor. The third inductor 1006 may be wound in a form surrounding the outer side of the second inductor 1005.

Alternatively, the arrangement order of the first inductor 1003 to the third inductor 1006 may be configured variously. For example, the first inductor 1003 may be wound in a form surrounding the outer side of the second inductor 1005. The third inductor 1006 may be wound in a form surrounding the outer side of the first inductor 1005. Alternatively, the second inductor 1005 may be wound in a form surrounding the outer side of the third inductor 1006. The first inductor 1003 may be wound in a form surrounding the outer side of the second inductor 1005.

In addition, the first inductor 1003 to the third inductor 1006 may be wound in various forms in a plurality of layers.

The first inductor 1003, the second inductor 1005, and the third inductor 1006 may be coupled electromagnetically in at least one of an edge-coupled scheme and a broad-side coupled scheme.

Meanwhile, the performances of the amplifiers according to the first to fourth exemplary embodiments of the present disclosure may be compared with reference to FIGS. 11 to 13 below.

Figure 11:
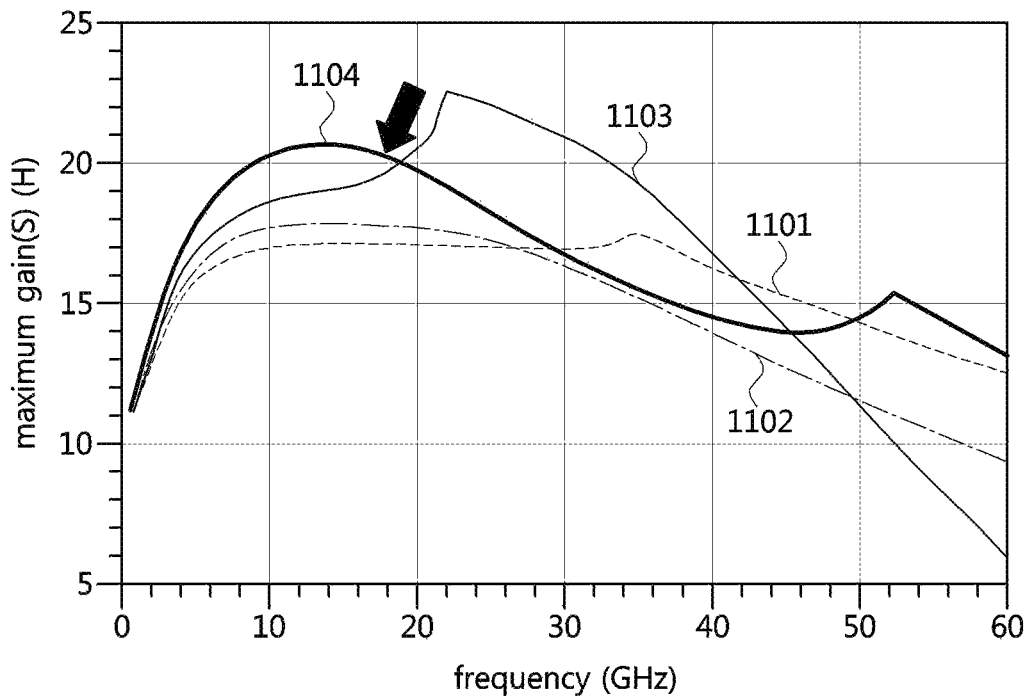
FIG. 11 is a graph illustrating maximum available gains (MAGs) of the amplifiers according to the exemplary embodiments of the present disclosure.

FIG. 11 is a graph illustrating maximum available gains (MAGs) of the amplifiers according to the exemplary embodiments of the present disclosure.

Referring to FIG. 11, a reference numeral 1101 denotes a change in a maximum available gain according to the frequency of the input signal of the amplifier 400 of FIG. 4 according to the first exemplary embodiment. A reference numeral 1102 denotes a change in a maximum available gain according to the frequency of the input signal of the amplifier 600 of FIGS. 6A and 6B according to the second exemplary embodiment. A reference numeral 1103 denotes a change in a maximum available gain according to the frequency of the input signal of the amplifier 700 of FIG. 7 according to the third exemplary embodiment. A reference numeral 1104 denotes a change in a maximum available gain according to the frequency of the input signal of the amplifier 1000 of FIGS. 10A and 10B according to the fourth exemplary embodiment.

The amplifier 1000 according to the fourth exemplary embodiment may have the highest maximum available gain according to the frequency magnitude on average than the amplifiers according to the first to third exemplary embodiments.

Figure 12:
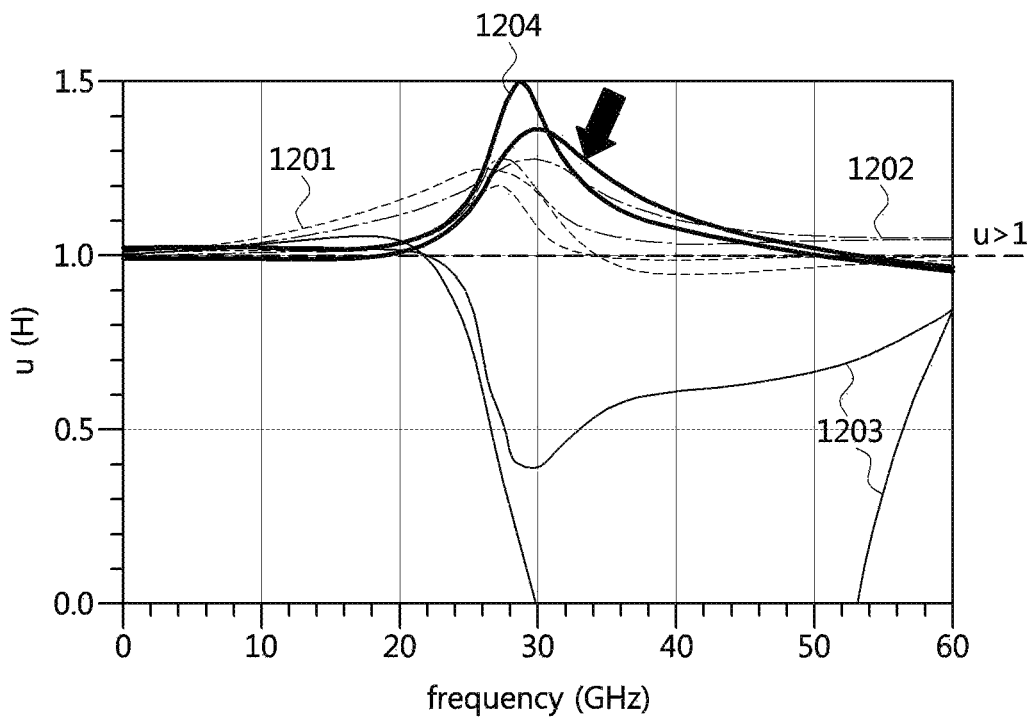
FIG. 12 is a graph illustrating stability factors of the amplifiers according to the exemplary embodiments of the present disclosure.

FIG. 12 is a graph illustrating stability factors of the amplifiers according to the exemplary embodiments of the present disclosure.

Referring to FIG. 12, a reference numeral 1201 denotes a change in a stability factor according to the frequency of the input signal of the amplifier 400 of FIG. 4 according to the first exemplary embodiment. A reference numeral 1202 denotes a change in a stability factor according to the frequency of the input signal of the amplifier 600 of FIGS. 6A and 6B according to the second exemplary embodiment. A reference numeral 1203 denotes a change in a stability factor according to the frequency of the input signal of the amplifier 700 of FIG. 7 according to the third exemplary embodiment. A reference numeral 1204 denotes a change in a stability factor according to the frequency of the input signal of the amplifier 1000 of FIGS. 10A and 10B according to the fourth exemplary embodiment.

The amplifier 1000 according to the fourth exemplary embodiment may have the highest stability factor according to the frequency than the amplifiers according to the first to third exemplary embodiments.

Figure 13:
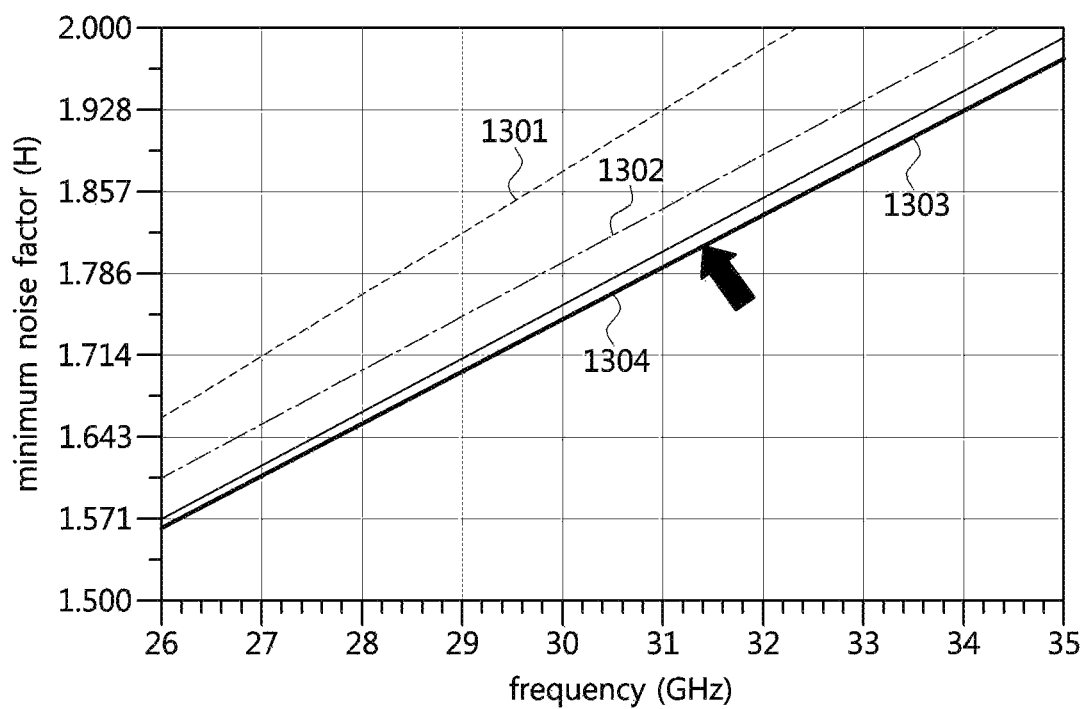
FIG. 13 is a graph illustrating minimum noise factors of the amplifiers according to the exemplary embodiments of the present disclosure.

FIG. 13 is a graph illustrating minimum noise factors of the amplifiers according to the exemplary embodiments of the present disclosure.

Referring to FIG. 13, a reference numeral 1301 denotes a change in a minimum noise factor according to the frequency of the input signal of the amplifier 400 of FIG. 4 according to the first exemplary embodiment. A reference numeral 1302 denotes a change in a minimum noise factor according to the frequency of the input signal of the amplifier 600 of FIGS. 6A and 6B according to the second exemplary embodiment. A reference numeral 1303 denotes a change in a minimum noise factor according to the frequency of the input signal of the amplifier 700 of FIG. 7 according to the third exemplary embodiment. A reference numeral 1304 denotes a change in a minimum noise factor according to the frequency of the input signal of the amplifier 1000 of FIGS. 10A and 10B according to the fourth exemplary embodiment.

The amplifier 1000 according to the fourth exemplary embodiment may have the lowest minimum noise factor according to the frequency than the amplifiers according to the first to third exemplary embodiments.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. An amplifier comprising:
first and second matching networks;
first and second transistors; and
a transformer including first to third inductors,
wherein a gate and a source of the first transistor are connected to the first matching network, one end of the first inductor is connected to a drain of the first transistor, the other end of the first inductor is connected to a source of the second transistor, one end of the second inductor is connected to a gate of the second transistor, the other end of the second inductor is grounded, one end of the third inductor is connected to a drain of the second transistor, and the other end of the third inductor is connected to the second matching network.

2. The amplifier according to claim 1, wherein the transformer comprises first to third layers, the first inductor is disposed in the first layer, the second inductor is disposed in the second layer, and the third inductor is disposed in the third layer.

3. The amplifier according to claim 1, wherein the second inductor is disposed to surround an outer side of the first inductor, and the third inductor is disposed to surround an outer side of the second inductor.

4. The amplifier according to claim 1, wherein the first matching network outputs an electrical signal input through an input port to the gate of the first transistor, and the first transistor outputs the electrical signal to the first inductor through the drain of the first transistor.

5. The amplifier according to claim 1, wherein the first inductor forms a first magnetic flux in accordance with an electrical signal, the second inductor forms a second magnetic flux by the first magnetic flux, and a direction of the second magnetic flux is opposite to a direction of the first magnetic flux.

6. The amplifier according to claim 5, wherein the second transistor forms a voltage at each of the source and the gate of the second transistor by the first magnetic flux, and a phase difference between the voltages of the source and gate of the second transistor is 180 degrees.

7. The amplifier according to claim 5, wherein the third inductor forms a third magnetic flux by the second magnetic flux, and a direction of the third magnetic flux is equal to the direction of the second magnetic flux.

8. The amplifier according to claim 1, wherein the first to third inductors are electromagnetically coupled.

9. A communication node comprising an antenna and an amplifier connected to the antenna,
wherein the amplifier comprises first and second matching networks; first and second transistors; and a transformer including first to third inductors, and
wherein a gate and a source of the first transistor are connected to the first matching network, one end of the first inductor is connected to a drain of the first transistor, the other end of the first inductor is connected to a source of the second transistor, one end of the second inductor is connected to a gate of the second transistor, the other end of the second inductor is grounded, one end of the third inductor is connected to a drain of the second transistor, and the other end of the third inductor is connected to the second matching network.

10. The communication node according to claim 9, wherein the transformer comprises first to third layers, the first inductor is disposed in the first layer, the second inductor is disposed in the second layer, and the third inductor is disposed in the third layer.

11. The communication node according to claim 9, wherein the second inductor is disposed to surround an outer side of the first inductor, and the third inductor is disposed to surround an outer side of the second inductor.

12. The communication node according to claim 9, wherein the first matching network outputs an electrical signal input through an input port to the gate of the first transistor, and the first transistor outputs the electrical signal to the first inductor through the drain of the first transistor.

13. The communication node according to claim 9, wherein the first inductor forms a first magnetic flux in accordance with an electrical signal, the second inductor forms a second magnetic flux by the first magnetic flux, and a direction of the second magnetic flux is opposite to a direction of the first magnetic flux.

14. The communication node according to claim 13, wherein the second transistor forms a voltage at each of the source and the gate of the second transistor by the first magnetic flux, and a phase difference between the voltages of the source and gate of the second transistor is 180 degrees.

15. The communication node according to claim 13, wherein the third inductor forms a third magnetic flux by the second magnetic flux, and a direction of the third magnetic flux is equal to the direction of the second magnetic flux.

16. The communication node according to claim 9, wherein the first to third inductors are electromagnetically coupled.

17. The communication node according to claim 9, further comprising a transmit signal processor, wherein the amplifier amplifies a transmit signal output by the transmit signal processor, and the antenna radiates the amplified transmit signal.

18. The communication node according to claim 9, further comprising a receive signal processor, wherein the antenna receives a receive signal, the amplifier amplifies the receive signal, and the receive signal processor processes the amplified receive signal.

* * * * *